United States Patent
Yen et al.

(10) Patent No.: US 10,291,261 B2
(45) Date of Patent: May 14, 2019

(54) EARLY SELECTION DECODING AND AUTOMATIC TUNING

(71) Applicant: SK Hynix Inc., Gyeonggi-do (KR)

(72) Inventors: Johnson Yen, Fremont, CA (US); HongChich Chou, Milpitas, CA (US); Yi-Min Lin, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 27 days.

(21) Appl. No.: 15/453,126

(22) Filed: Mar. 8, 2017

(65) Prior Publication Data

US 2017/0310342 A1 Oct. 26, 2017

Related U.S. Application Data

(60) Provisional application No. 62/327,319, filed on Apr. 25, 2016.

(51) Int. Cl.
*H03M 13/37* (2006.01)

(52) U.S. Cl.
CPC .............. *H03M 13/3715* (2013.01)

(58) Field of Classification Search
CPC .................................... H03M 13/11
USPC ....................... 714/758, 760, 762
See application file for complete search history.

(56) References Cited

U.S. PATENT DOCUMENTS

| 8,065,583 | B2 | 11/2011 | Radke |
| 8,255,763 | B1* | 8/2012 | Yang ............... H04L 1/0065 |
| | | | 714/755 |
| 2009/0055715 | A1* | 2/2009 | Jashek ............ H04L 1/0045 |
| | | | 714/776 |
| 2009/0106625 | A1 | 4/2009 | Jun et al. |
| 2010/0169735 | A1* | 7/2010 | Biscondi ........ H03M 13/1117 |
| | | | 714/752 |
| 2011/0138247 | A1* | 6/2011 | Limberg ........... H04L 1/0041 |
| | | | 714/751 |
| 2011/0252286 | A1 | 10/2011 | Li et al. |

FOREIGN PATENT DOCUMENTS

| CN | 101465654 B | 6/2009 |
| CN | 100566183 C | 12/2009 |

* cited by examiner

*Primary Examiner* — Fritz Alphonse
(74) *Attorney, Agent, or Firm* — Kilpatrick Townsend & Stockton LLP

(57) ABSTRACT

Techniques are described for codeword decoding. In an example, a system computes a checksum for a codeword based on the codeword and a parity check matrix. The system compares the checksum to thresholds. Each threshold is associated with a different decoder from a plurality of decoders available on the system. The system selects a decoder from the plurality of decoders. The decoder is selected based on the comparison of the checksum to the thresholds. The system decodes the codeword by using the selected decoder.

20 Claims, 6 Drawing Sheets

EARLY SELECTION DECODING AND AUTOMATIC TUNING

CROSS-REFERENCES TO RELATED APPLICATIONS

The present application claims priority to Provisional Application No. 62/327,319 entitled "EARLY SELECTION DECODING AND AUTOMATIC TUNING," filed Apr. 25, 2016, which is assigned to the assignee hereof and expressly incorporated by reference herein in its entirety.

BACKGROUND

In a solid state drive (SSD) controller of a system, the error correction code (ECC) decoding time is critical for read latency. How to efficiently decode data read from NAND flash memory is an important topic for system performance.

Typically, several ECC decoding schemes are available on the system and can be used to process the read data. Each of the decoding schemes has different power consumption and decoding capability, including latency and bit error rate (BER). The system processes the read data through the decoding schemes serially to achieve an overall BER. However, the serial decoding increases the latency and power consumption for noisy data (with more error bits) because each decoding scheme takes time and consumes power to process the data. Certain applications may necessitate a particular BER while also being time critical and/or power sensitive. For at least these applications, the resulting latency and/or power consumption of the serial decoding can be unacceptable. In addition, performance of other less time critical and/or power sensitive applications can be improved by reducing the latency and/or power consumption.

BRIEF SUMMARY

Techniques for codeword decoding are described. In an example, a system implements multiple decoding schemes. Each scheme is associated with a particular decoding performance, such as a particular bit error rate, decoding failure rate, latency, data throughput, and/or power consumption. To decode a codeword, the system selects a particular decoding scheme and processes the codeword according to the selected decoding scheme. This avoids the need to process the codeword with the various decoding schemes as is the case for the above-described existing systems. Because only one decoding scheme is used, the latency, data throughput, and/or power consumption of the system are improved relative to the existing systems. To achieve a desired bit error rate and/or a desired decoding failure, the system selects the decoding scheme that can achieve the desired performance. This selection accounts for the noise level of the codeword.

For example, the system quantifies the noise level by computing a checksum for the codeword. The checksum is computed by applying a checksum function to the codeword and a parity check matrix that should be used to decode the codeword. Generally, the higher the checksum is, the noisier the codeword is. The system compares the checksum to different thresholds. Each threshold is associated with one of the decoding schemes. These thresholds are derived based on a simulation of the decoding performance and can be automatically tuned over time based on the actual, observed decoding performance. The system selects the decoding scheme based on the comparison and applies the decoding scheme to the codeword.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
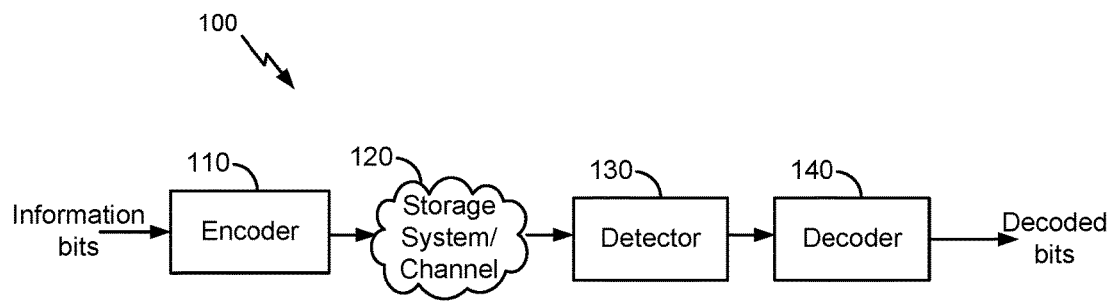
FIG. 1 illustrates an example high level block diagram of an error correcting system, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of the present disclosure involve improving an overall performance of a system that implements a plurality of decoding schemes. Relative to existing decoding systems, latency and power consumption are reduced and data throughput is increased for a similar or same BER. Rather than serially processing data, the noise level of the data can be computed before the data enters the system. Given the noise level, a particular decoding scheme from the plurality of schemes is selected and the data is forwarded to this scheme for decoding. The selected decoding scheme may be the best available scheme (e.g., most optimal from the available ones), where the decoding optimality is defined relatively to the latency, data throughput, power consumption, and bit error rate.

In an example embodiment, a codeword (e.g., an ECC code) is classified into one of a plurality of predefined groups. Each group corresponds to a different decoding scheme. The classification involves a computation of the codeword's noise level and of a comparison of the noise level to thresholds. Each threshold is associated with one of the decoding schemes. Generally, the higher the threshold, the more resilient the decoding scheme is to the noise level (e.g., the higher the latency and power consumption are and the lower the BER is relative to other decoding schemes having lower thresholds). The thresholds can be initialized to values developed through simulation and automatically tuned over time given an observed decoding performance. The automatic tuning improves the system performance because, for instance, some of NAND characteristics may change over the operating time. By doing so, the thresholds can be tuned as optimally as possible and the classification of codewords can remain or become more correct. If classified into a particular group, the corresponding decoding scheme is used for processing the codeword. This overall process of classifying and selecting a decoding scheme is referred to herein as an "early selection decoding and automatic tuning" (ESDAT) process.

The ESDAT process provides many improvements over decoding processes of existing systems. For example, a similar or same BER is achieved because the proper decoding scheme is selected given the noise level. Further, the overall latency and power consumption of the system are improved because only one decoding scheme may be used for a codeword, as opposed to using all available decoding schemes. Because the latency is decreased, the overall data throughput is increased.

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes may include turbo product codes (TPC), low density parity check codes (LDPC), Bose-Chaudhuri-Hocquenghem (BCH) codes, Reed Solomon codes, and the like.

FIG. 1 illustrates an example high level block diagram of an error correcting system 100, in accordance with certain embodiments of the present disclosure. In the example shown, the system 100 includes an encoder 110, a storage system 120, a detector 130, and a decoder 140. The encoder 110 receives information bits that include data which is desired to be stored in the storage system 120 or transmitted in a communications channel. Encoded data is output by the encoder 110 and is written to the storage system 120. In various embodiments, the storage system 120 may include a variety of storage types or media, such as magnetic disk drive storage, flash storage, etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested or otherwise desired (e.g., by an application or a user), the detector 130 receives the data from the storage system 120. The received data may include some noise or errors. The detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to the decoder 140 which performs decoding using the decision and/or reliability information. A soft input decoder utilizes both the decision and the reliability information to decode the codeword. A hard decoder utilizes only the decision values in the decoder to decode the codeword. After decoding, the decoded bits generated by the decoder 140 are passed to the appropriate entity (e.g., the user or application which requested it). With proper encoding and decoding, the information bits match the decoded bits.

The decoder 140 may implement a number of decoding schemes (e.g., decoding algorithms implemented using application-specific integrated circuit (ASIC), a field-programmable gate array (FPGA), and/or a general purpose processor (e.g., an Advanced RISC Machine (ARM) core) depending on the type of the codeword and whether or not reliability information corresponding to each bit is available. Example decoding schemes include a one-read bit flipping decoder, a one-read min-sum hard decoder, a two-read min-sum soft decoder, and a multiple-read min-sum soft decoder, which are further illustrated in the next figures in the interest of clarity of explanation. Embodiments of the present inventions are not limited to these example decoding schemes and similarly to other ones including, for example, sum-product, Chase, Bose Chaudhuri Hocquengham (BCH), and Viterbi decoding algorithms.

Figure 2:
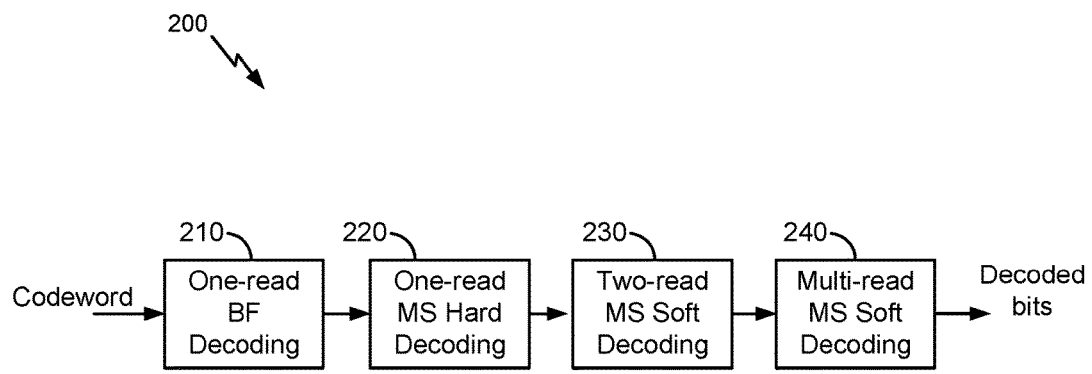
FIG. 2 illustrates an example prior art decoding system that is part of an error correcting system.

FIG. 2 illustrates an example prior art decoding system 200 that is part of an error correcting system. The decoding system 200 includes a number of decoders serially connected. A codeword is an input to the first decoder in the serial connection and decoded bits are output from the last decoder in the serial connection.

As illustrated, the serial connection includes a one-read bit flipping decoding scheme 210 that corresponds to the first decoder. Under this decoding scheme 210, the number of satisfied check nodes and the number of unsatisfied check nodes connected to a variable node are determined. If the number of unsatisfied check nodes is relatively greater, the variable node is flipped (e.g., from "0" to "1" or vice versa). Relative to other decoding schemes of the serial connection, the one-read bit flipping decoding scheme 210 has the highest BER and the lowest latency and power consumption.

Output from the first decoder is input to a second decoder that implements a one-read min-sum hard decoding scheme 220. This decoding scheme 220 implements hard decoding based on an approximation of a belief propagation algorithm, where the approximation overestimates the reliabilities of the check node messages. Relative to the one-read bit flipping decoding scheme 210, the one-read min-sum hard decoding scheme 220 has a lower BER, but higher latency and power consumption.

Output from the second decoder is input to a third decoder that implements a two-read min-sum soft decoding scheme 230. Unlike the one-read min-sum hard decoding scheme 220, the two-read min-sum soft decoding scheme 230 implements soft decoding and reads the input twice. Hence, the two-read min-sum soft decoding scheme 230 has relatively an even lower BER, but higher latency and power consumption.

Output from the third decoder is input to a last decoder that implements a multiple-read min-sum soft decoding scheme 240. This decoding scheme 240 is similar to the two-read min-sum soft decoding scheme 230 except that the input is read a number "N" of times, where "N" is equal or greater than three. In a typical implementation, "N" is set to seven. Hence, the multiple-read min-sum soft decoding scheme 240 has the lowest BER and highest latency and power consumption across all four decoding schemes.

Given the serial connection, the overall latency of the decoding system 200 is the sum of the four latencies. Similarly, the overall power consumption is the sum of the individual power consumptions of each of the four decoders.

Figure 3:
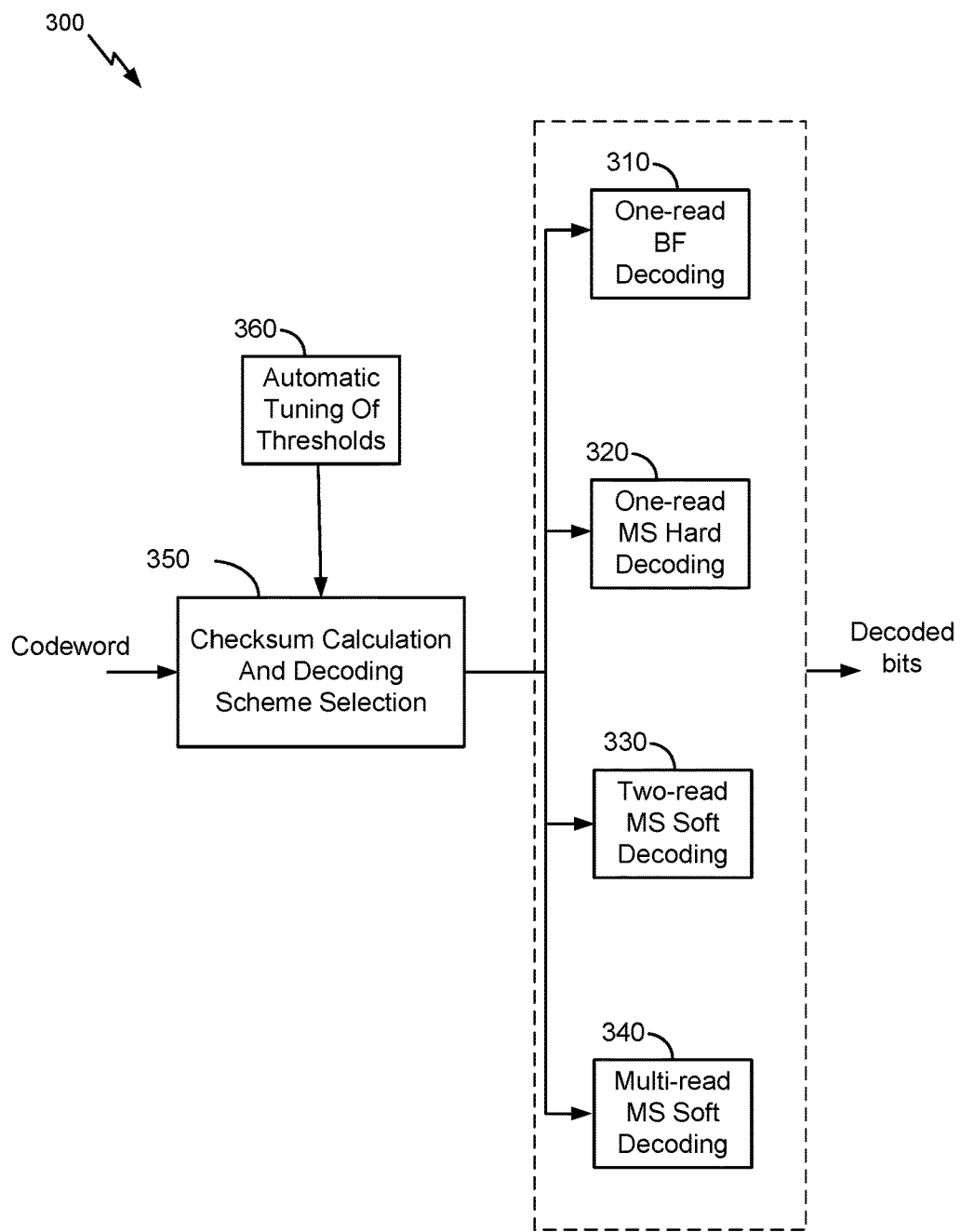
FIG. 3 illustrates an example early selection decoding and automatic tuning system that is part of an error correcting system, in accordance with certain embodiments of the present disclosure.

FIG. 3 illustrates an example ESDAT system 300 that is part of an error correcting system, in accordance with certain embodiments of the present disclosure. The ESDAT system 300 can be implemented within a decoding system, such as the decoder 140 of FIG. 1.

In the interest of describing performance improvements by the embodiments of the present disclosure, FIG. 3 illustrates an implementation of the ESDAT system 300 that utilizes one-read bit flipping, one-read min-sum hard, two-read min-sum soft, and multiple-read min-sum soft decoding schemes that are similar to the decoding schemes 210-240 of FIG. 2. Embodiments of the present disclosure are not limited to this number or example types of decoding schemes, and similarly apply to other number and types of decoding schemes including, for example, sum-product, Chase, Bose Chaudhuri Hocquengham (BCH), and Viterbi decoding algorithms. Further, Embodiments of the present disclosure are not limited to one particular type of codes (e.g., low density parity check (LDPC) codes that rely on a Tanner graph of variable and check nodes). The embodiments similarly apply to other types of ECC, whether these codes are block codes or convolutional codes and whether the decoders decode on a binary basis or a non-binary (e.g., symbol) basis.

The ESDAT system 300 includes a number of decoders. FIG. 3 illustrates this number as four decoders. Each decoder implements a particular decoding scheme (e.g., unique to the decoder and different from the remaining decoding schemes). Generally, each decoding scheme is associated with a particular performance (e.g., achieves particular BER and data throughput at particular latency and power consumption). Four decoding schemes are illustrated including a one-read bit flipping decoding scheme 310 corresponding to a first decoder, a one-read min-sum hard decoding scheme 320 corresponding to a second decoder, a two-read min-sum soft decoding scheme 330 corresponding to a third decoder, and a multiple-read min-sum soft decoding scheme 340 corresponding to a fourth decoder. Unlike the decoders of the decoding system 200 of FIG. 2, the four decoders of the ESDAT system 300 are not serially connected.

Rather than serially processing a codeword, the ESDAT system 300 selects one of the decoders (or, equivalently, one of the decoding schemes 310-340) based on a rule. Decoded bits are output from the selected decoder. In an example, the selection involves classifying the codeword (or, similarly, the codeword's noise level) into one of a plurality of predefined groups that correspond to the decoding scheme 310-340. The classification involves a computation of the codeword's noise level and of a comparison of the noise level to thresholds. Each threshold is associated with one of the decoding schemes 310-340. The computation of the noise includes, for instance, the calculation of a checksum for the codeword. Generally, the higher the checksum is, the higher the noise level is. The rule and the thresholds can be stored in the memory of the ESDAT system 300.

The rule specifies a selection given the checksum (or, similarly, the noise level). For example, for a BER critical application, the rule specifies that, the higher the checksum is (or, similarly, the noise level), the selection should be made for a better BER performing decoding scheme (e.g., one that has a lower BER although resulting in a higher latency and/or a higher power consumption). In another example, for a time critical and/or power consumption sensitive application, the rule specifies that, the higher the checksum is (or, similarly, the noise level), the selection should be made for a better latency and/or power consumption performing decoding scheme (e.g., one that has a lower latency and/or a lower power consumption although resulting in a higher BER).

In an example, to select the proper decoding scheme, the ESDAT system 300 implements a checksum calculation and decoding scheme selection (CCDSS) module 350 and an automatic tuning of thresholds (ATT) module 360. Each of these modules 350 and 360 can be implemented in hardware or in a combination of software or firmware and hardware.

The CCDSS module 350 is configured to select a decoding scheme by classifying the codeword (or, similarly, the codeword's noise level) and applying the rule. In an example, the CCDSS module 350 computes the checksum for the codeword based on the codeword and a parity check matrix. This matrix is used to decode the codeword. The checksum represents or includes a count of unsatisfied check nodes. For instance, the CCDSS module 350 applies a checksum function that includes a product of the codeword and a transpose of the parity check matrix (e.g., checksum=$cH^T$, where "c" is a vector representation of the codeword and "$H^T$" is the transpose of the parity check matrix "H"). The CCDSS module 350 then compares the checksum to the thresholds. Based on the comparison and the rule, the CCDSS module 350 classifies the codeword (or its noise level) and/or selects the proper decoding scheme. The codeword is input to the decoder that implements the selected decoding scheme. Example operations of the CCDSS module 350 are further illustrated in connection with the flows of the next figures.

The ATT module 360 is configured to set and maintain the thresholds associated with the different decoding schemes 310-340. In an example, the thresholds are initialized to particular values. These values can be set based on a simulation of codeword decoding by the ESDAT system 300 and/or individually by the decoding schemes 310-340. The simulation may measure an expected performance, such as measured latencies, bit error rates, data throughputs, and/or power consumptions depending on the type of application (e.g., BER performance for a BER critical application, latency performance for a latency critical application, etc.). Generally, a threshold associated with a decoder (or, equivalently, a decoding scheme) is set based on the decoding scheme that is unique to the decoder. Because the performance depends on the type of the decoding scheme, the threshold is, thus, set based on the latency, bit error rate, data throughput, and/or power consumption of the decoding scheme.

To illustrate, the threshold for selecting the one-read bit flipping hard decoding scheme 310 is set to a value of "750." Thus, if the checksum of the codeword is smaller than "750," this decoding scheme 310 is selected. The threshold for selecting the one-read min-sum hard decoding scheme 320 is set to a value range between value between "750" and "1,150." Thus, if the checksum of the codeword falls in this range, the one-read min-sum hard decoding scheme 320 is selected. Given that the one-read min-sum hard decoding scheme 320 has relatively a lower BER, a lower data throughput, and a higher latency and power consumption, its threshold value range is larger than that of the one-read bit flipping hard decoding scheme 310 (set as "0" to "750"). This approach implements the above rule for BER critical applications.

Similarly, the threshold for selecting the two-read min-sum soft decoding scheme 330 is set to a value range between value between "1,150" and "1,400." If the checksum of the codeword falls in this range, this decoding scheme 330 is selected. In comparison, the threshold for selecting the multi-read min-sum soft decoding scheme 340 is set to a value of "1,400." If the checksum of the codeword is larger than "1,400," this decoding scheme 340 is selected. Of course other thresholds (e.g., value ranges) are possible depending on the desired performance and the type and number of available decoding systems on the ESDAT system 300.

The ATT module 360 also automatically maintains the thresholds over time. Specifically, the performance of the ESDAT system 300 may change over time. For instance, the ESDAT system 300 is implemented as part of a flash storage system. In such storage system, NAND characteristics may change over the operating time. The hard error of the NAND device may affect ECC decoding capability and the thresholds need to be adapted to lower values to ensure codeword classification processing can generate correct result along the way. The impact of hard error becomes severe over the time as endurance and retention prolong. Adjusting the thresholds to account for such changes enables the ESDAT system 300 to more accurately select the proper decoding scheme. In other words, this automatic tuning can adjust the values of the thresholds according to endurance and retention of NAND devices.

In an example, the ATT module 360 monitors the actual performance of the ESDAT system 300 and/or the individual, actual performances of the decoding schemes 310-340. This performance represents the observed performance of codeword decoding. The ATT module 360 compares the observed performance to the actual performance to detect whether a deviation exists or not. If the deviation exists and is larger than a particular threshold, the ATT module 360 adjusts the thresholds. The adjustments can be specified by the rule. For example, the observed BER performance of the one-read bit flip hard decoding scheme 310 is worse than the expected BER performance by 0.1% (or some other threshold value). This deviation indicates that the noise level of the codewords (or, similarly, checksum) is higher than expected and, thus, a better BER performing decoding scheme should be used. Accordingly, the ATT module 360 decreases the threshold of the decoding scheme 310 from "750" to some smaller value (e.g., to "700" if the rule specifies a "50" decrement). The ATT module 360 also lowers the threshold value range of the one-read min-sum hard decoding scheme 320 to the smaller value (e.g., to "700"). In this way, codewords that have checksums between "700" and "750" would no longer be processed through the one-read bit flipping hard decoding scheme 310. Instead, the one-read min-sum hard decoding scheme 320 would be used for these codewords, thereby, improving the overall BER performance of the ESDAT system 300. Example operations of the ATT module 360 are further illustrated in connection with the flows of the next figures.

The ESDAT system 300 provides many performance improvements over existing decoding systems. Examples of such improvements are described herein next based on comparisons to the decoding system 200 of FIG. 2. Both systems 200 and 300 use the same four decoding schemes for data reads from NAND devices, albeit the systems 200 and 300 have a different overall architecture. With the ESDAT system 300, almost all the high-noisy codewords do not need to go through different level of decoding schemes and run up to maximum iterations before changing to a next decoding scheme.

Generally, because the ESDAT system 300 selects a particular decoding scheme for a codeword given the codeword's noise level, the overall expected BER can be achieved. Further and relative to the decoding system 200, the overall latency and overall power consumption are relatively smaller as only one decoding scheme is used per codeword instead of potentially all four.

From NAND measurement data, data throughput improvement measured in one is about 41.6%. This throughput improvement can be explained for the following reasons. If the decoding system 200 is used, all of the codewords may need to go through the four decoding schemes. The average decoding iterations can be about 13.23. But if the ESDAT system 300 is used, the average decoding iteration for one-read hard decoding may be around 9.34. The average iteration for soft decoding may be approximately similar (9.34). The data throughput improvement in one example of 4,608 codewords is as follows. For the decoding system 200, the data throughput is avg_itr=13.23: 4608/(13.23*298 cycles*1/400 MHz)=467.5 MB/s. In comparison, for the ESDAT system 300, the data throughput is avg_itr=9.34: 4608/(9.34*298 cycles*1/400 MHz)=662.2 MB/s. This represents an improvement of (662.2-467.5)/467.5=41.6%.

Also from NAND measurement data, the latency is improved. For example, the latency through the three min-sum decoding schemes is about 11.5 µs for the decoding system 200. In comparison, this latency is about 6.21 µs for the ESDAT system 300. This represents a latency improvement of (11.5-6.21)/6.21=85%. Specific values for the measured latencies are shown in the next table.

| Checksum threshold range | Average iterations for MS hard decoding in threshold range | Percentage of codewords in threshold range | Relative percentage of codewords in the range of 750~max | Latency for each decoding scheme without ESDAT (μs) | Overall average latency (us) (Latency* percentage) |
|---|---|---|---|---|---|
| 750~1150 (One-read hard decoding) | 9.34 | 18.21% | 87.25% | 6.21 | 5.42 |
| 1150~1400 (Two-read hard decoding) | 39.99 | 2.56% | 12.27% | 46.21 | 5.67 |
| 1400~max (Multiple-read hard decoding) | 40 | 0.10% | 0.48% | 86.21 | 0.41 |
| Total latency | | | | | 11.50 |

Figure 4:
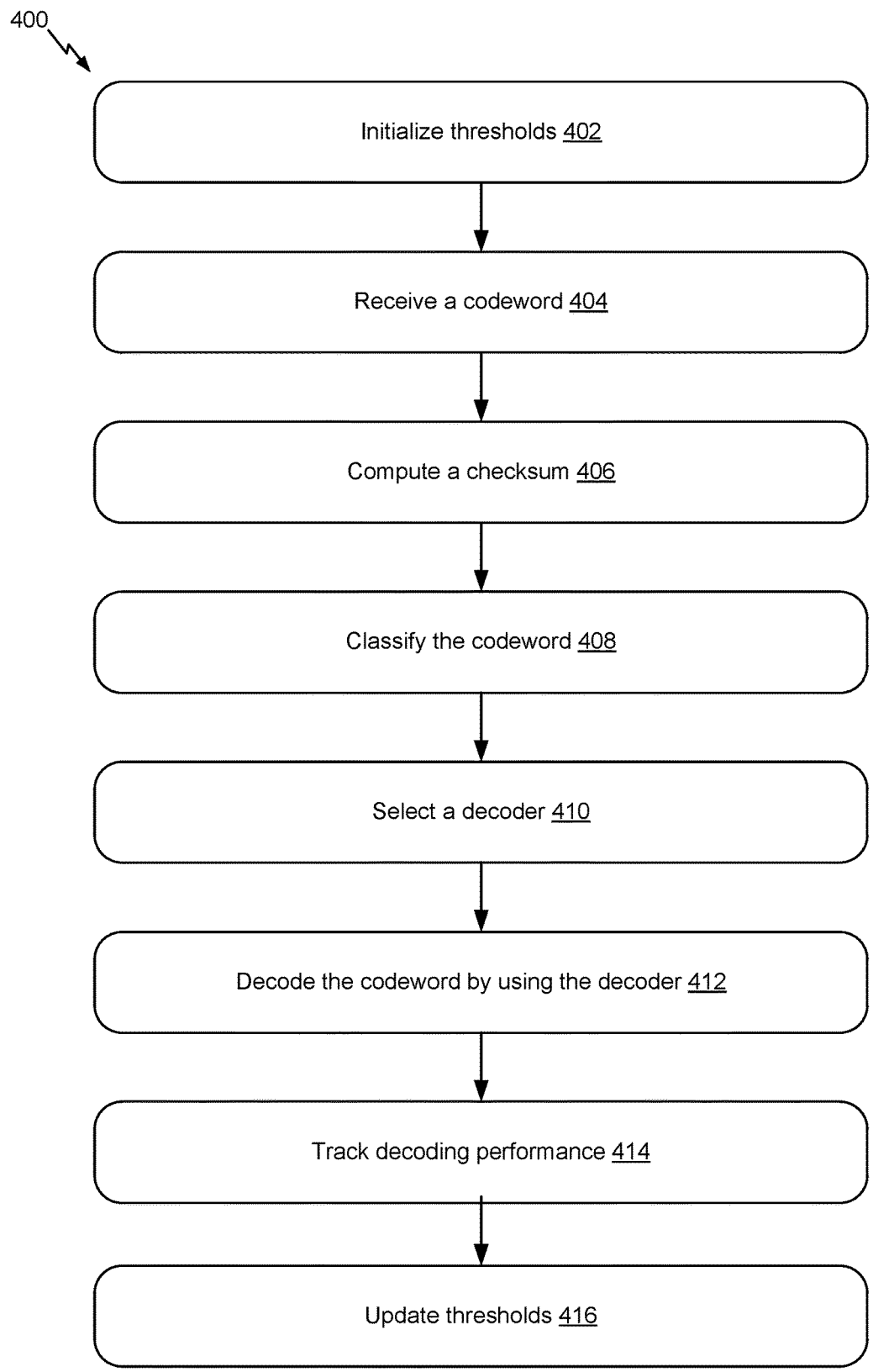
FIG. 4 illustrates an example flow for selecting a decoder from a plurality of decoders prior to decoding a codeword, in accordance with certain embodiments of the present disclosure.
Figure 5:
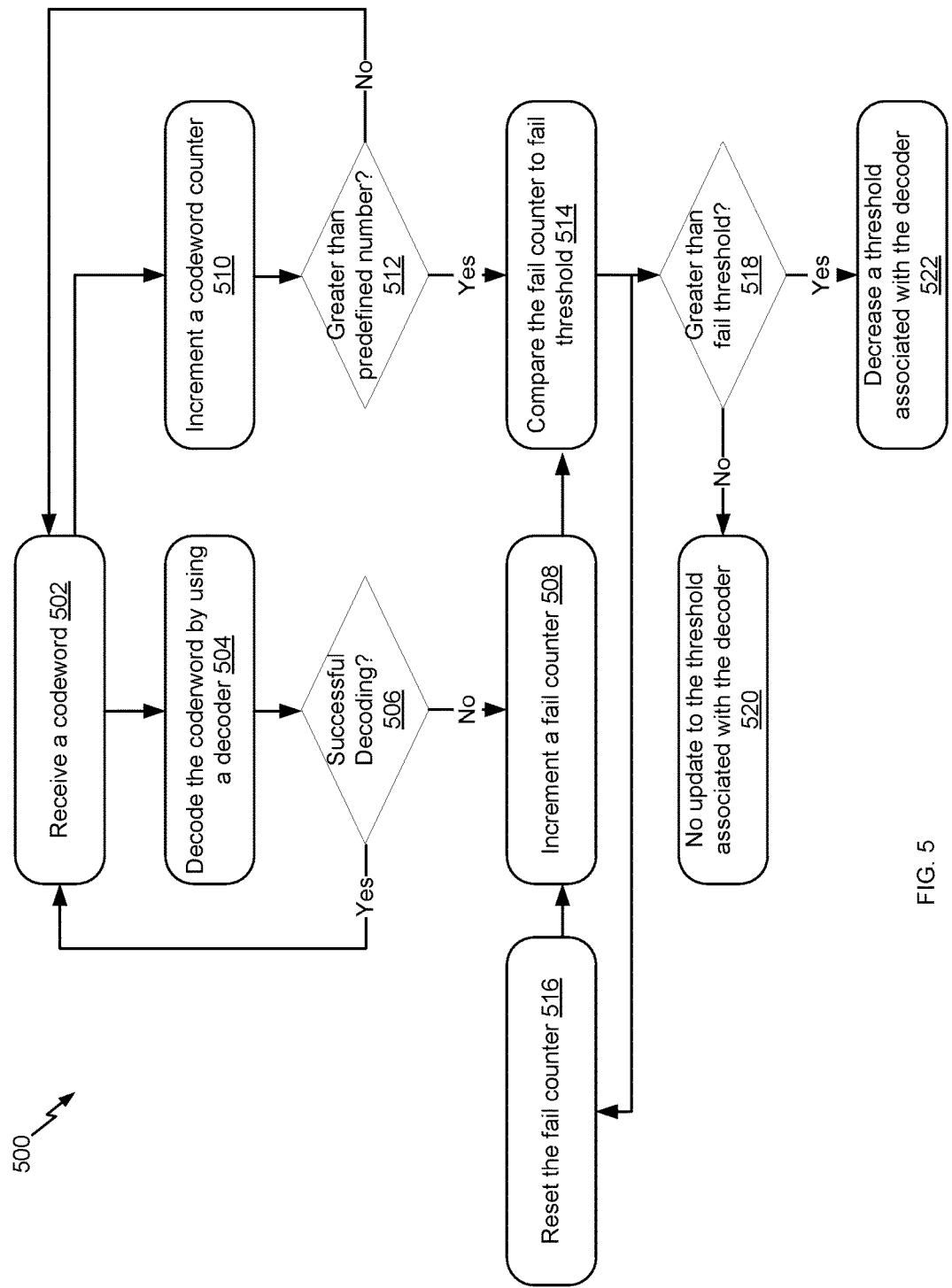
FIG. 5 illustrates an example flow for automatically tuning a threshold usable in a selection of a decoder, in accordance with certain embodiments of the present disclosure.
Figure 6:
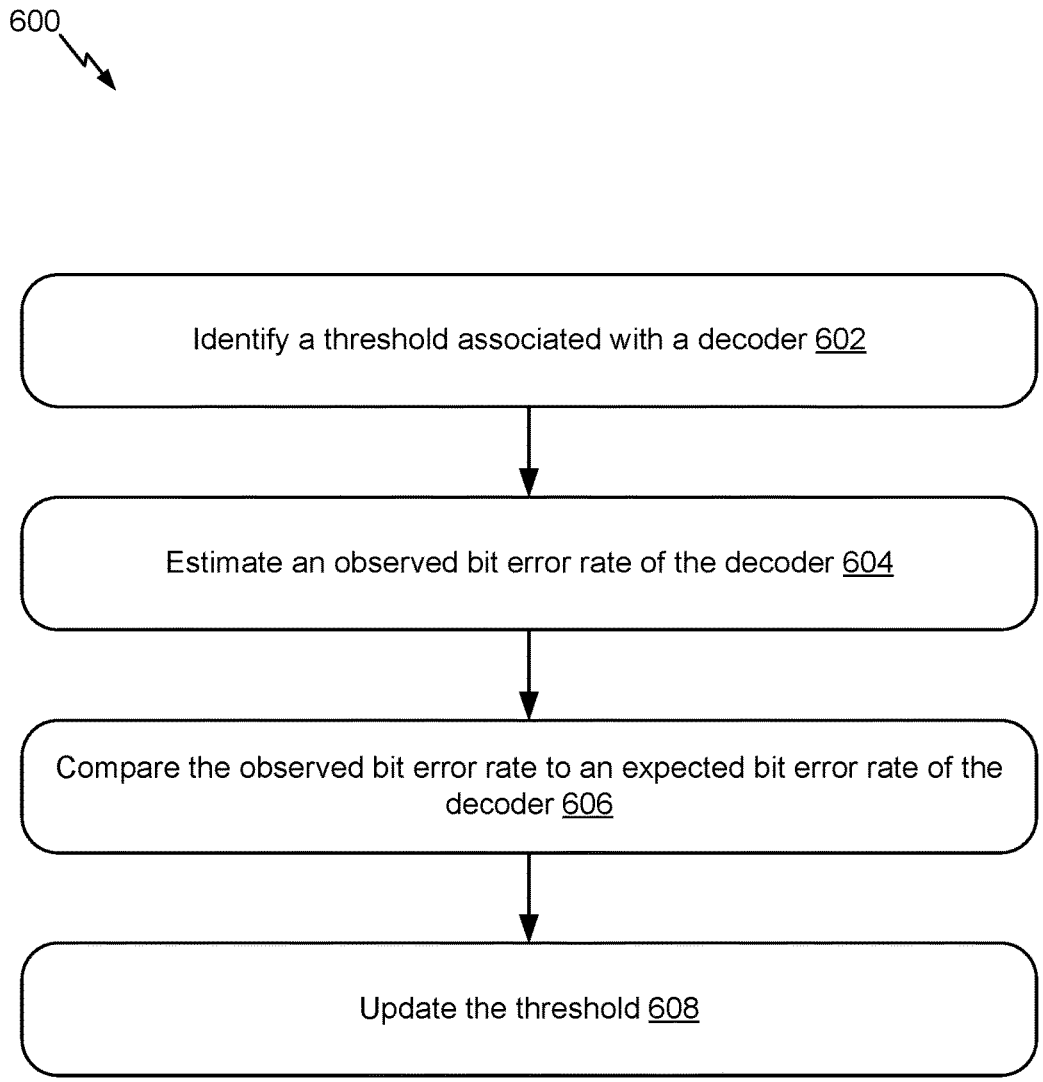
FIG. 6 illustrates another example flow for automatically tuning a threshold usable in a selection of a decoder, in accordance with certain embodiments of the present disclosure.

Turning to FIGS. 4-6, the figures illustrate example flows for processing a codeword. A system, such as an ECC system or a decoding system within the ECC system, may be configured to perform the illustrative flows. Instructions for performing the operations of the illustrative flows can be stored as computer-readable instructions on a non-transitory computer-readable medium of the system. As stored, the instructions represent programmable modules that include code or data executable by a processor of the system. The execution of such instructions configures the system to perform the specific operations shown in the figures and described herein. While the operations are illustrated in a particular order, it should be understood that no particular order is necessary and that one or more operations may be omitted, skipped, and/or reordered.

FIG. 4 illustrates an example flow 400 for selecting a decoder from a plurality of decoders prior to decoding a codeword, in accordance with certain embodiments of the present disclosure. The plurality of decoders represents a decoding system, such as the decoder 140, and may be implemented within the ESDAT system 300 of FIG. 3. Each decoder implements a decoding scheme unique to the decoder.

The example flow 400 starts at operation 402, where the system (e.g., the ATT module 360) initializes thresholds. In an example, each threshold can be defined as a range of values (e.g., between "0" and "750," "750" and "1,150," etc.). Each threshold can also be uniquely associated with one of the decoding schemes. The values can be derived from performance simulations and stored along with the association to the decoding schemes in the memory of the system. The system initializes thresholds given the values in the memory.

At operation 404, the system receives a codeword that should be decoded. For example, in a storage application, the codeword is read from storage, where the codeword was encoded and stored using an ECC code (e.g., LDPC code, turbo code, etc.). A parity check matrix is available from the memory of the system and is used for decoding the read codeword.

At operation 406, the system (e.g., the CCDSS module 350) computes a checksum for the codeword. For example, the checksum is the count of unsatisfied check nodes. A "0" checksum indicates that all check nodes are satisfied, and accordingly, there are no decoding errors. A checksum other than "0" indicates the presence of a decoding error. The system applies a checksum function to the codeword and the parity check matrix to compute the checksum.

At operation 408, the system (e.g., the CCDSS module 350) classifies the codeword (or, similarly, the noise level of the codeword). In an example, the classification depends on the checksum and the thresholds. For instance, the system compares the checksum to the thresholds. If the checksum falls in a value range defined for a particular threshold associated with a particular decoding scheme, the system classifies the codeword (or, similarly, the noise level) as one that should be decoded using the particular decoding scheme.

At operation 410, the system (e.g., the CCDSS module 350) selects a decoder for decoding the codeword. The selection can be based on the classification performed at operation 408 and/or the comparison of the checksum to the thresholds performed at operation 406. If the classification is used, the system selects the decoder that implements the particular decoding scheme. If the classification is not used but only the comparison is, the system performs the selection according to a rule stored in the memory of the system. Generally, the rule specifies the selection of a decoding scheme (or, equivalently, a decoder) based on which threshold value range the checksum falls in, such that a proper decoding scheme is selected to achieve a desired performance (a BER performance, a latency performance, and/or other performances) given the noise level (as quantified by the checksum).

At operation 412, the system decodes the codeword by using the decoder that was selected at operation 410. For example, the codeword is input to the selected decoder. The decoding scheme unique to this decoder is applied to accordingly decode the codeword.

Although operations 404-412 are illustrated within the context of decoding a single codeword, the decoding of a larger number of codewords is likewise possible. For example, the system repeats operations 402-412 to decode each of the codewords. Alternatively, a batch decoding approach can be implemented. Under this approach, a set of the codewords is processed. The selection of a decoder (e.g., by performing operations 404-410) occurs by processing a subset of the codewords, while the decoding (e.g., as performed at operation 412) is applied to the entire set. For instance, the first codeword in the set is processed to select the decoder and then the decoder is used for all the codewords in the set. In another illustration, the first codeword is processed for the selection, that codeword and the nine next codewords are decoded by using the selected decoder, the eleventh codeword is then processed to update the selection as needed, and the proper decoding is applied to that and the next nine codewords, and so on and so forth.

At operation 414, the system tracks the decoding performance. For example, the BER, decoding failures, latency, throughput, and/or power consumptions for performing codeword decoding (including the decoding of the codeword as illustrated in the above operations) are observed. This tracking allows the system to adjust the thresholds as needed.

At operation 416, the system updates the threshold based on the monitoring. For example, if the observed performance deviates from the expected performance, the system adjusts (e.g., increases or decreases) a value range defined for a threshold. The adjustment can be specified in the rule stored in the memory of the system. For instance, to improve a BER, a threshold associated with a decoding scheme is decreased (e.g., the lower end of the associated value range) if the observed BER or decoding failure for that decoding scheme is higher than expected. In another illustration, to improve a latency, the threshold is increased for that decoding scheme if the latency is higher than expected and the decoding scheme provides faster decoding relative to other decoding schemes. The example flows of FIGS. 5 and 6 further illustrate particular implementations of operations 414 and 416.

FIG. 5 illustrates an example flow 500 for automatically tuning a threshold usable in a selection of a decoder, in accordance with certain embodiments of the present disclosure. Generally, the example flow 500 tracks a number of decoding failures of the decoder (e.g., its decoding failure rate) and compares this number to a fail threshold. If the difference between the number of decoding failures and the fail threshold is greater than a particular value, the difference indicates an unacceptable failure rate. Accordingly, the system adjusts the threshold (e.g., the lower end and/or upper end of the associated value range) to reduce the failure rate (associated with the decoding of the next codewords) below the fail threshold, thereby improving the decoding performance. The example flow 500 is illustrated in connection with tracking the decoding failure rate of a particular decoder. However, the example flow 500 similarly applies to tracking the decoding failure rates of the remaining decoders of the system and/or the overall decoding failure rate of the system itself.

The example flow 500 starts at operation 502, where the decoder receives a codeword. For example, the system inputs the codeword to the decoder following a selection of this decoder for decoding the codeword. This selection can be performed by the system according to operations 404-410 of the example flow 400 of FIG. 4.

At operation 504, the decoder decodes the codeword. For example, the decoder applies its decoding scheme to the codeword. This application results in either a decoding success (albeit it could have an error) or a decoding failure (e.g., the decoding scheme is not capable of decoding the codeword given the amount of errors).

At operation 506, the system determines whether the decoding was successful or not. For example, the system receives an indication of the decoding success or the decoding failure from the decoder. If successful, operation 502 is performed after operation 506 such that the next codeword is processed. If failure, operation 508 is performed after operation 506.

At operation 508, the system increments a fail counter. In an example, a predefined number codewords (e.g., 4,608 codewords, or some other number) should be decoded by the decoder before adjusting the threshold associated with the decoder (regardless of decoding successes or failures). The fail counter is initialized to "0" (or some other value) prior to the start of the decoding and is reset to "0" (or some other value) once the decoding and any adjustments to the threshold are complete. Because a decoding failure was observed while decoding one of the codewords, the system increments the fail counter by "1" (or some other value).

At operation 510, the system increments a codeword counter. This operation can be performed in parallel to operation 504. Because the predefined number of codewords should be decoded before adjusting the threshold, operation 510 enables the system to track the actual number of the decoded codewords (regardless of decoding successes or failures). In an example, the codeword counter is initialized to "0" (or some other value) prior to the start of the decoding and is reset to "0" (or some other value) once the decoding and any adjustments to the threshold are complete. Because the codeword was received at operation 502, the system increments the codeword counter by "1" (or some other value).

At operation 512, the system determines whether the codeword counter is greater than or equal to the predefined number of codewords or not. If it is greater, this determination indicates that all of the predefined codewords have been decoded (regardless of whether the individual decoding was successful or not). Accordingly, operation 514 is performed. If it is smaller, the determination indicates that there are remaining codewords to be decoded. In this case, operation 512 is followed by operation 502.

At operation 514, the system compares the fail counter to a fail threshold. This operation is performed only if the word counter is greater than or equal to the predefined number of codewords. The system accesses the most up-to-date fail counter (e.g., the one from operation 508, after the decoding of the predefined number of codewords, the determination of decoding successes and failures, and applicable increments to the fail counter). The fail threshold can be set to a certain value (e.g., "0" or some other value). This value can be derived from the performance simulation of the system and/or decoder. Generally, the smaller the value is, the smaller the acceptable deviation is between the observed and expected performances.

At operation 516, the system resets the fail counter to the default value (e.g., "0" or some other value). This operation is performed after the comparison of the fail counter to the fail threshold.

At operation 518, the system determines whether the fail counter is greater than the fail threshold based on the comparison. If it is smaller, the determination indicates that the decoding failure rate is acceptable. Accordingly, no adjustments to the threshold are needed. In this case, operation 520 follows operation 518. At operation 520, the system maintains the threshold (e.g., does not update the lower and upper ends of the value range defined for the threshold). In comparison, if the fail counter is greater than the fail threshold, the determination indicates that the decoding failure rate is unacceptable. Accordingly, an adjustment(s) to the threshold is needed. In this case, operation 522 follows operation 518.

At operation 522, the system decreases the threshold. For instance, the lower end of the value range is decreased by a certain value. In an example, the decrease can be specified in the rule stored in the memory of the system. The decrease helps reduce the decoding failure rate when decoding a next set of codewords because codewords with relatively high checksums (e.g., having higher noise values) may no longer be decoded with the decoder.

FIG. 6 illustrates another example flow for automatically tuning a threshold usable in a selection of a decoder, in accordance with certain embodiments of the present disclosure. Generally, the example flow 600 compares an observed bit error rate to an expected bit error rate. If the difference between the two rates is greater than a threshold, this difference indicates that the observed bit error rate is unacceptable. Accordingly, the system adjusts the threshold (e.g., the lower end and/or upper end of the associated value range) to improve the observed bit error rate for the next set of codewords.

The example flow 600 starts at operation 602, where the system identifies a threshold associated with a decoder. For example, the threshold may be defined as a value range that is stored in the memory of the system. Accordingly, the threshold can be accessed from the memory.

At operation 604, the system estimates an observed BER for the decoder. In an example, training codewords are used during a simulation phase. The training codewords (represented as a matrix "TC") are input to the decoder at known BERs (represented as a vector "B"). A weight vector "W" is computed, where the product of "TC" and "W" is the BER vector "B." The weight vector "W" is stored in the memory of the system. Upon decoding different codewords (represented as a matrix "DC"), the observed BER is estimated as the product of "DC" and "W."

At operation 606, the system compares the observed BER to the expected BER. The expected BER can be stored in the memory of the system and can depend on the power consumption of the decoder. Accordingly, the system accesses the expected BER from the memory given the power consumption.

At operation 608, the system updates the threshold. For example, if the difference between the observed BER and the expected BER is greater than a certain value (e.g., 0.1% or some other threshold value), the system determines that an adjustment to the threshold is needed. The type (e.g., decrease or increase) and amount of adjustment can be specified in the rule. For instance, if the difference is greater than 0.1%, the threshold can be decreased by a value of "10."

Figure 7:
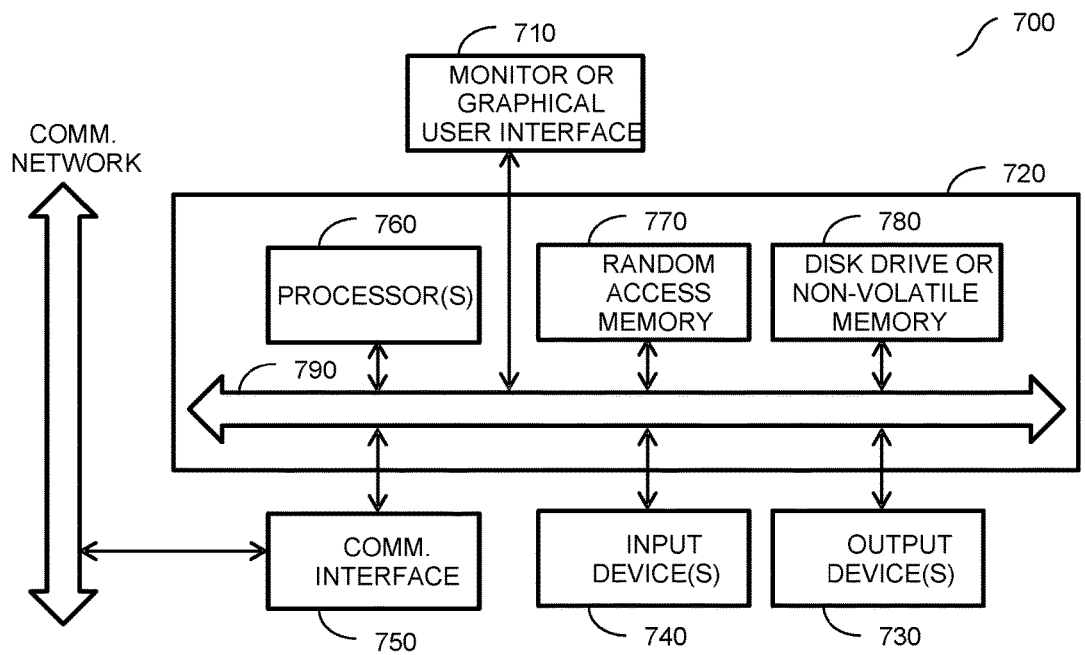
FIG. 7 describes one potential implementation of a system which may be used, according to one embodiment.

FIG. 7 describes one potential implementation of a system which may be used, according to one embodiment. FIG. 7 is merely illustrative of an embodiment of the present disclosure and does not limit the scope of the disclosure as recited in the claims. In one embodiment, the system is a computer system 700 that typically includes a monitor 710, a computer 720, user output devices 730, user input devices 740, communications interface 750, and the like. The system 100 of FIG. 1 implements some or all of the components of the computer system 700.

As shown in FIG. 7, the computer 720 may include a processor(s) 760 that communicates with a number of peripheral devices via a bus subsystem 790. These peripheral devices may include the user output devices 730, the user input devices 740, the communications interface 750, and a storage subsystem, such as random access memory (RAM) 770 and disk drive 780.

The user input devices 730 include all possible types of devices and mechanisms for inputting information to the computer system 720. These may include a keyboard, a keypad, a touch screen incorporated into the display, audio input devices such as voice recognition systems, microphones, and other types of input devices. In various embodiments, the user input devices 730 are typically embodied as a computer mouse, a trackball, a track pad, a joystick, wireless remote, drawing tablet, voice command system, eye tracking system, and the like. The user input devices 730 typically allow a user to select objects, icons, text and the like that appear on the monitor 710 via a command such as a click of a button or the like.

The user output devices 740 include all possible types of devices and mechanisms for outputting information from the computer 720. These may include a display (e.g., the monitor 710), non-visual displays such as audio output devices, etc.

The communications interface 750 provides an interface to other communication networks and devices. The communications interface 750 may serve as an interface for receiving data from and transmitting data to other systems. Embodiments of the communications interface 750 typically include an Ethernet card, a modem (telephone, satellite, cable, ISDN), (asynchronous) digital subscriber line (DSL) unit, FireWire interface, USB interface, and the like. For example, the communications interface 750 may be coupled to a computer network, to a FireWire bus, or the like. In other embodiments, the communications interfaces 750 may be physically integrated on the motherboard of the computer 720, and may be a software program, such as soft DSL, or the like.

In various embodiments, the computer system 700 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 720 includes one or more Xeon microprocessors from Intel as the processor(s) 760. Further, one embodiment, the computer 720 includes a UNIX-based operating system.

The RAM 770 and the disk drive 780 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 770 and the disk drive 780 may be configured to store the basic programming and data constructs that provide the functionality of the present disclosure.

Software code modules and instructions that provide the functionality of the present disclosure may be stored in the RAM 770 and the disk drive 780. These software modules may be executed by the processor(s) 760. The RAM 770 and the disk drive 780 may also provide a repository for storing data used in accordance with the present disclosure.

The RAM 770 and the disk drive 780 may include a number of memories including a main random access memory (RAM) for storage of instructions and data during program execution and a read only memory (ROM) in which fixed non-transitory instructions are stored. The RAM 770 and the disk drive 780 may include a file storage subsystem providing persistent (non-volatile) storage for program and data files. The RAM 770 and the disk drive 780 may also include removable storage systems, such as removable flash memory.

The bus subsystem 790 provides a mechanism for letting the various components and subsystems of the computer 720 communicate with each other as intended. Although the bus subsystem 790 is shown schematically as a single bus, alternative embodiments of the bus subsystem may utilize multiple busses.

FIG. 7 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A computer-implemented method for codeword decoding on a system, the computer-implemented method comprising:
computing a checksum for a codeword based on the codeword and a parity check matrix;
comparing the checksum to thresholds, wherein each threshold is associated with a different decoder from a plurality of decoders available on the system;
selecting a decoder from the plurality of decoders, wherein the decoder is selected based on the comparison of the checksum to the thresholds; and
decoding the codeword by using the decoder, wherein:
a threshold associated with the decoder is updated based on a comparison between an observed performance and an expected performance, wherein each of the observed performance and expected performance comprises at least of a bit error rate, a number of decoding failures, a decoding latency, or a power consumption,
the observed performance is computed based on the decoding of the codeword, and
the threshold is decreased based on the comparison indicating that the observed performance is worse than the expected performance.

2. The computer-implemented method of claim 1, wherein the checksum comprises a count of unsatisfied check nodes based on the parity check matrix.

3. The computer-implemented method of claim 1, wherein computing the checksum comprises applying a checksum function, and wherein the checksum function comprises a product of the codeword and a transpose of the parity check matrix.

4. The computer-implemented method of claim 1, wherein each of the plurality of decoders implements a unique decoding scheme that is associated with a decoding latency and a bit error rate, and wherein the decoder is selected based on a rule that specifies that, the higher the checksum is, a selection is for a higher decoding latency, lower bit error rate decoding scheme.

5. The computer-implemented method of claim 1, wherein the plurality of decoders comprise a one-read bit flipping decoder, a one-read min-sum hard decoder, a two-read min-sum soft decoder, and a multiple-read min-sum soft-decoder.

6. The computer-implemented method of claim 5, wherein the one-read bit flipping decoder is selected based on the checksum having a value smaller than 750.

7. The computer-implemented method of claim 5, wherein the one-read min-sum hard decoder is selected based on the checksum having a value between 750 and 1,150.

8. The computer-implemented method of claim 5, wherein the two-read min-sum soft decoder is selected based on the checksum having a value between 1,150 and 1,400.

9. The computer-implemented method of claim 5, wherein the multiple-read min-sum soft decoder is selected based on the checksum having a value larger than 1,400.

10. A system comprising:
a plurality of decoders;
one or more processors; and
one or more memories communicatively coupled with the one or more processors and storing instructions that, upon execution by the one or more processors, configure the system to at least:
classify a codeword based on a checksum associated with the codeword and based on thresholds associated with the plurality of decoders;
select a decoder from the plurality of decoders based on the classification of the codeword; and
decode the codeword by using the decoder, wherein:
a threshold associated with the decoder is updated based on a comparison between an observed performance and an expected performance, wherein each of the observed performance and expected performance comprises at least of a bit error rate, a number of decoding failures, a decoding latency, or a power consumption, the observed performance is computed based on the decoding of the codeword, and the threshold is decreased based on the comparison indicating that the observed performance is worse than the expected performance.

11. The system of claim 10, wherein the checksum is computed based on the codeword and a parity check matrix, and wherein each threshold is associated with a different decoder from the plurality of decoders.

12. The system of claim 10, wherein classifying the codeword comprises comparing the checksum to the thresholds, and wherein the decoder is selected based on the comparison of the checksum to the thresholds.

13. The system of claim 10, wherein the thresholds are set based on a simulation of codeword decoding and measured latencies and bit error rates.

14. The system of claim 10, wherein the threshold associated with the decoder is set based on a decoding scheme unique to the decoder.

15. The system of claim 14, wherein the threshold is set based on the decoding latency and the bit error rate of the decoding scheme.

16. One or more non-transitory computer-readable storage media comprising instructions that, upon execution on a system, configure the system to perform operations comprising:

computing a checksum for a codeword based on the codeword and a parity check matrix;

comparing the checksum to thresholds, wherein each threshold is associated with a different decoder from a plurality of decoders of the system;

selecting a decoder from the plurality of decoders, wherein the decoder is selected based on the comparison of the checksum to the thresholds; and decoding the codeword by using the decoder, wherein:

a threshold associated with the decoder is updated based on a comparison between an observed performance and an expected performance, wherein each of the observed performance and expected performance comprises at least of a bit error rate, a number of decoding failures, a decoding latency, or a power consumption, the observed performance is computed based on the decoding of the codeword, and the threshold is decreased based on the comparison indicating that the observed performance is worse than the expected performance.

17. The one or more non-transitory computer-readable storage media of claim 16, wherein the thresholds are updated over time based on the decoding of the codeword.

18. The one or more non-transitory computer-readable storage media of claim 16, wherein the threshold associated with the decoder is updated based on a comparison between an observed bit error rate and an expected bit error rate, wherein the observed bit error rate is computed based on the decoding of the codeword, and wherein the threshold is decreased based on the comparison of the observed bit error rate and the expected bit error rate indicating that the observed bit error rate is higher than the expected bit error rate.

19. The one or more non-transitory computer-readable storage media of claim 16, wherein the threshold associated with the decoder is updated based on tracking the number of decoding failures of the decoder and comparing the number to a fail threshold.

20. The one or more non-transitory computer-readable storage media of claim 19, wherein the tacking is repeated for a predefined number of codewords that are decoded with the decoder, and wherein the threshold is decreased based on the number of decoding failures being greater than the fail threshold after decoding the predefined number of codewords.

* * * * *